United States Patent [19]
Ichihara

[11] Patent Number: 5,329,253
[45] Date of Patent: Jul. 12, 1994

[54] FREQUENCY SYNTHESIS USING FREQUENCY CONTROLLED CARRIER MODULATED WITH PLL FEEDBACK SIGNAL

[75] Inventor: Masaki Ichihara, Tokyo, Japan
[73] Assignee: NEC Corporation, Tokyo, Japan
[21] Appl. No.: 968,151
[22] Filed: Oct. 26, 1992
[30] Foreign Application Priority Data
Oct. 25, 1991 [JP] Japan ............................. 3-280004
[51] Int. Cl.$^5$ ............................................. H03L 7/18
[52] U.S. Cl. .................................. 331/17; 331/25; 328/14
[58] Field of Search ..................... 331/17, 25; 328/14

[56] References Cited
U.S. PATENT DOCUMENTS

| | | | |
|---|---|---|---|
| 4,145,667 | 3/1979 | Messerschmitt | 331/16 |
| 4,878,035 | 10/1989 | Vendely et al. | 332/101 |
| 4,965,533 | 10/1990 | Gilmore | 331/18 |

FOREIGN PATENT DOCUMENTS
2227698 12/1972 Fed. Rep. of Germany .

*Primary Examiner*—Siegfried H. Grimm
*Attorney, Agent, or Firm*—Young & Thompson

[57] ABSTRACT

In a frequency synthesizer, a phase detector receives an externally generated reference clock signal of a constant frequency and a feedback signal to produce an error signal, which is output through a loop filter to a voltage controlled oscillator. A direct digital synthesizer (DDS) receives the reference clock signal and externally generated phase data to produce a DDS output signal whose frequency is precisely controlled by the phase data. The DDS output signal is applied as a carrier to a differential detector where it is modulated with the output of the VCO to produce a signal corresponding to the lower sideband of the modulated carrier. The output of the differential detector is output to the phase detector as the feedback signal.

10 Claims, 3 Drawing Sheets

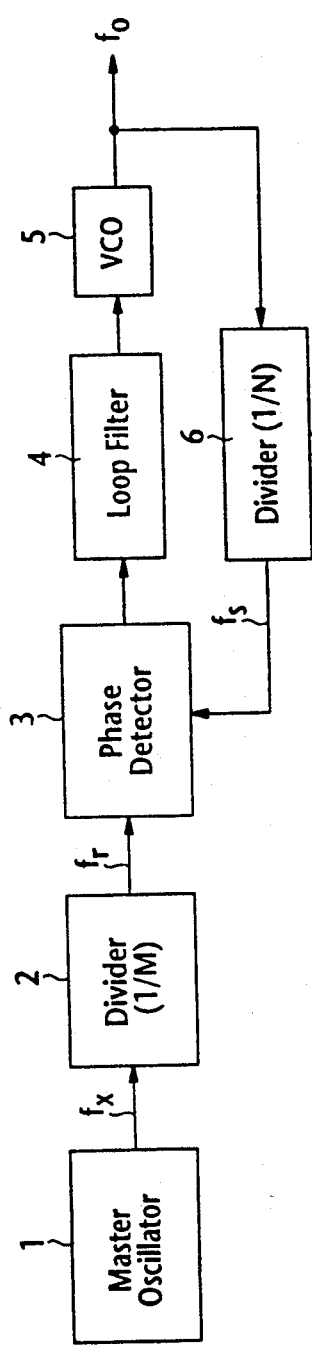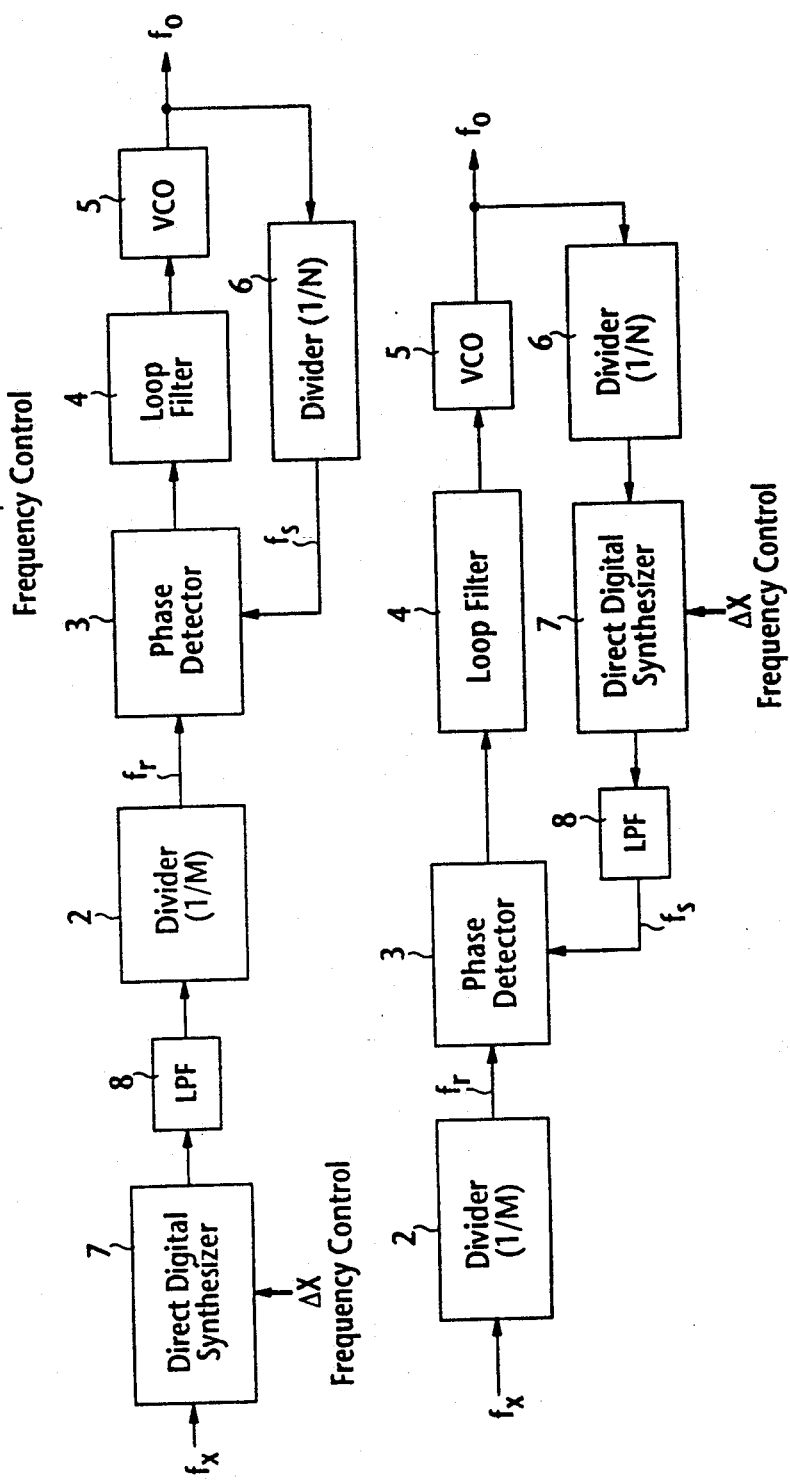
FIG. 1a PRIOR ART
FIG. 1b PRIOR ART
FIG. 1c PRIOR ART

FREQUENCY SYNTHESIS USING FREQUENCY CONTROLLED CARRIER MODULATED WITH PLL FEEDBACK SIGNAL

BACKGROUND OF THE INVENTION

The present invention relates generally to phase lock loop frequency synthesizers, and more specifically to a direct digital synthesizer driven phase lock loop frequency synthesizer which is particularly suitable for use in applications, such as digital cellular telephony, where communications channels are switched from one channel to another at significantly high speeds.

As shown in FIG. 1a, a typical conventional phase lock loop frequency synthesizer synthesizes a frequency by using a control voltage to drive a voltage controlled oscillator 5 which generates a signal of frequency $f_o$ near the desired frequency. A frequency divider 6 is used to divide the VCO signal output frequency by an integer value N to produce a signal of frequency $f_s$. The frequency-$f_s$ signal is input along with a signal of reference frequency $f_r$ to a phase detector 3. The phase detector compares the frequencies of the two input signals and outputs a voltage proportional to the difference in frequency of the two input signals. The output of the phase detector 3 is coupled through a loop filter 4, where it is input to the VCO 5 as the control voltage. The reference frequency ($f_r$) signal is derived by a divide-by-M frequency divider 2 which divides a signal of high accuracy frequency $f_x$ from a master oscillator 1 by a constant integer value M. The integer N of frequency divider 6 is variable by an incremental frequency control voltage so that if the VCO 5 were generating exactly the desired frequency, the resultant frequency-$f_s$ signal would be exactly the same frequency as reference frequency $f_r$ and the following relation holds:

$$f_o = (N)(f_x/M) \qquad (1)$$

As the frequency control voltage is varied, the output frequency $f_o$ varies accordingly from one frequency, or channel, to another, and the minimum channel separation, or frequency step size or resolution, $\Delta f_o$ is given by:

$$\Delta f_o = f_x/M \qquad (2)$$

To insure loop stability the loop filter needs to have a cutoff frequency much lower than the reference frequency. However, the lock-in time of the frequency synthesizer is inversely proportional to the cutoff frequency. Since the reference frequency is predetermined, the lock-in time cannot be reduced and hence, is a detrimental factor to achieve high speed channel switching.

This slow lock-in operation is overcome by techniques shown and described in U.S. Pat. No. 4,965,533. To provide mathematical analysis of this patent, two embodiments of the prior art PLL frequency synthesizer are shown respectively in FIGS. 1b and 1c of this specification. One of the prior-art embodiment, shown in FIG. 1b, incorporates a direct digital synthesizer (DDS) 7 that is clocked by the master oscillator to serve as the source of the reference frequency for the phase lock loop. The DDS typically comprises a phase accumulator which receives a digital fine frequency control signal $\Delta X$ to determine the phase increment for accumulation at the master clock rate. The accumulated phase value is output to a sine lookup table, which stores sine values and provides an output signal, indicative of the digital representation of a periodic waveform, as an input to a digital-to-analog converter. The output of the D/A converter is filtered by a low-pass filter 8 and input to the frequency divider 2, whose output is used as a variable reference frequency input to the phase detector. Thus, frequency divider 6 operates as a constant-value divider. When the accumulated phase reaches a certain threshold, the phase accumulator automatically resets itself to repeat the accumulation process. Thus, the phase accumulator can be said to operate with a modulo value. If this modulo value is represented as L, the reference frequency $f_r$ is given by:

$$f_r = (f_x)(\Delta X)/L \qquad (3)$$

and the synthesizer output frequency $f_o$ is expressed by:

$$f_o = (N)(f_r) = (N)(f_x)(\Delta X)/L \qquad (4)$$

Since the frequency control is provided by DDS 7 in response to increment $\Delta X$, the minimum frequency step size $\Delta f_o$ is equal to a variation in the output frequency $f_o$ that occurs in response to an increment of $\Delta X = 1$. Therefore, the following relation holds:

$$\Delta f_o = (N)(f_x/L) \qquad (5)$$

From Equations (3) and (5), the relation $f_r = (\Delta f_o)(\Delta X/N)$ is obtained. This implies that by setting the increment $\Delta X$ at a value greater than the integer N, the reference frequency $f_r$ can be set higher than the reference frequency of the FIG. 1a frequency synthesizer for a given minimum frequency resolution. For example, using a minimum frequency step size of 25 kHz, a master clock frequency $f_x = 12.8$ MHz and an integer N = 1024, Equation (5) gives a modulo value $L = 2^{19}$. If the output frequency $f_o$ is chosen at 1 GHz, Equation (4) gives an increment $\Delta X = 40000$, a value much greater than the integer N = 1024. Thus, a reference frequency of 976.5625 kHz, much higher than $\Delta f_o = 25$ kHz, is obtained. While high speed convergence of the phase lock loop can be achieved, variation of the reference frequency causes a control voltage variation at the input of the VCO, a variation known as "reference leak", which would result in the transmission of spurious frequencies. A band rejection filter must be provided as part of the loop filter 4 to eliminate the undesired spurious transmission. However, it is difficult to eliminate the undesirable components uniformly across all channels of the frequency synthesizer.

According to the other prior art technique shown in FIG. 1c, DDS 7 and low-pass filter 8 are provided in the phase lock loop, following the output of divider 6, so that the divided frequency signal $f_s$ is caused to vary in response to phase increment $\Delta X$, while reference frequency $f_r$ remains constant, thus giving the following relations:

$$f_s = (f_o)(\Delta X)/(N)(L) \qquad (6)$$

$$f_x/M = (f_o)(\Delta X)/(N)(L) \qquad (7)$$

$$\text{Thus, } f_o = (f_x)(N)(L)/(M)(\Delta X) \qquad (8)$$

While this technique eliminates the reference leak problem, the fact that the output frequency $f_o$ varies inversely proportional to the increment $\Delta X$, as given by Equation (8), makes it impossible to set all channels of the synthesizer at precisely equal frequency intervals.

SUMMARY OF THE INVENTION

It is therefore an object of the present invention to provide a phase lock loop frequency synthesizer that allows high speed setting of a selected frequency from a plurality of precisely equally spaced apart frequencies without causing reference leak.

According to the present invention, there is provided a frequency synthesizer which comprises a phase detector having a reference input for receiving an externally generated reference signal of a constant frequency, a feedback input, and a phase detector output, a loop filter having an input coupled to the phase detector output, and a loop filter output, and a voltage controlled oscillator having an input coupled to the loop filter output, and an oscillator output for providing a synthesizer output signal. A direct digital synthesizer (DDS) having a clock input for receiving the reference signal, a frequency control input for receiving externally generated phase data, and a DDS output. A differential detector means is provided having a first input coupled to the oscillator output, a second input coupled to the DDS output for producing a differential signal indicative of a frequency difference between signals at the first and second inputs, and a differential detector output coupled to the feedback input of the phase detector for providing thereto the differential signal.

The direct digital synthesizer comprises a phase accumulator having a phase input for receiving the phase data, a clock input for receiving the reference signal for accumulating the phase data at the rate of the reference signal, and an accumulator output, a memory having a plurality of addressable storage locations each storing a predetermined sine value, an address input coupled to the accumulator output, and a memory output, and a digital to analog converter having a converter input coupled to the memory output, and a converter output coupled to the second input of the differential detector means.

According to a first embodiment of the present invention, the differential detector means comprises a mixer having a first input coupled to the DDS output, a second input coupled to the oscillator output, and a mixer output, and a low-pass filter having an input coupled to the mixer output, and an output coupled to the feedback input of the phase detector.

According to a second embodiment of the present invention, the differential detector means comprises an additional phase accumulator having a phase input for receiving constant value phase data, a clock input coupled to the oscillator output as the first input of the differential detector means, and an additional accumulator output, a subtractor having a first input coupled to the first-mentioned accumulator output and a second input coupled to the additional accumulator output, and a subtractor output coupled to the address input of the memory as the first-mentioned accumulator output, and a low-pass filter having an input coupled to the converter output as the second input of the differential detector means and an output coupled to the feedback input of the phase detector as the differential detector output.

Preferably, the frequency synthesizer includes a divide-by-M frequency divider having an input for receiving the reference clock signal, and an output coupled to the reference input of the phase detector, and a divide-by-N frequency divider having an input coupled to the oscillator output and an output coupled to the first input of the differential detector means as the oscillator output.

BRIEF DESCRIPTION OF THE DRAWINGS

The present invention will be described in further detail with reference to the accompanying drawings, in which:

FIGS. 1a is a block diagram of a conventional phase lock loop frequency synthesizer, and FIGS. 1b and 1c are block diagrams of the phase lock loop frequency synthesizers of the aforesaid U.S. patent;

DETAILED DESCRIPTION

Figure 2:
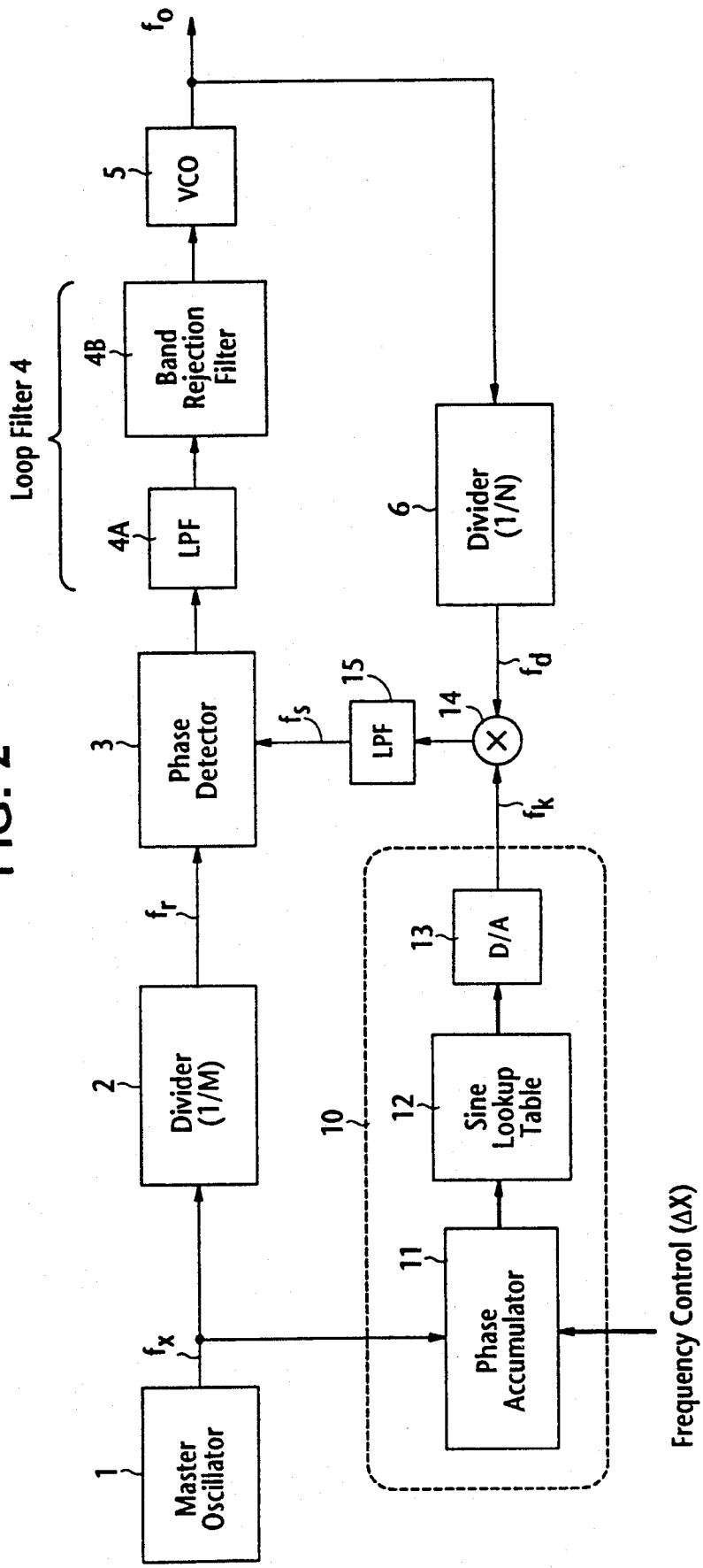
FIG. 2 is a block diagram of a first embodiment of this invention.

Referring now to FIG. 2, there is shown a phase lock loop frequency synthesizer according to a first embodiment of the present invention. The PLL frequency synthesizer of the present invention comprises a direct digital synthesizer 10 which is clocked by the master oscillator 1. DDS 10 includes a phase accumulator 11 which operates with modulo L and receives a digital fine frequency control signal $\Delta X$ to determine the phase increment for accumulation at the master clock rate. The accumulated phase value is output to a sine lookup table 12, which stores sine values and uses the accumulated phase value as an address signal to provide an output signal, indicative of the digital representation of a sinusoidal waveform at frequency $f_k$, as an input to a digital-to-analog converter 13. Sine lookup table 12 is typically implemented with a read only memory. The output of the D/A converter 13 is input to an analog mixer 14 as a local carrier and mixed with the output signal of frequency $f_d$ from frequency divider 6 to produce a signal that is indicative of the amplitude modulation of the divided frequency signal $f_d$. The output of mixer 14 is filtered by a low-pass filter 15 to remove undesired higher frequencies and input to phase detector 3 as a signal of frequency $f_s$.

The embodiment of FIG. 2 can be analyzed as follows:

$$f_k = (f_x)(\Delta X)/L \tag{9}$$

$$f_d = f_o/N \tag{10}$$

$$f_s = f_d - f_k = f_o/N - (f_x)(\Delta X)/L \tag{11}$$

Since $f_r = f_x/M$, and $f_r = f_s$ when the frequency synthesizer converges, the following Equation holds:

$$f_x/M = f_o/N - (f_x)(\Delta X)/L \tag{11}$$

Thus, the output frequency $f_o$ and the minimum frequency step size $\Delta f_o$ of the frequency synthesizer are given as:

$$f_o = (N)(f_x)\{L + (\Delta X)(M)\}/(L)(M) \tag{12}$$

$$\Delta f_o = (N)(f_x)/L \tag{13}$$

Equation (12) indicates that all channels of the synthesizer can be set at precisely equal frequency intervals. In addition, since Equation (13) is identical to Equation (5), the minimum frequency step size of the present embodiment is as small as that of the prior art of FIG. 1b. A further advantage is that, by virtue of the constant reference frequency, reference leak can be easily removed by a simple band rejection filter 4B which forms the loop filter 4 with a low-pass filter 4A. Moreover, the reference frequency can be chosen at a desired high value regardless of the step size $\Delta f_o$, the frequency synthesizer can be converged at a high speed.

With a step size of 25 kHz, a master clock frequency $f_x = 12.8$ MHz and an integer $N = 512$, Equation (13) gives a modulo value of $L = 2^{18}$. If the integer M is set equal to 8 and the desired output frequency $f_o$ is 1 GHz, Equation (12) provides $\Delta X = 7232$. A reference frequency $f_r$ of as high as 1.6 MHz can therefore be obtained, which is sufficiently high to achieve high speed convergence.

Figure 3:
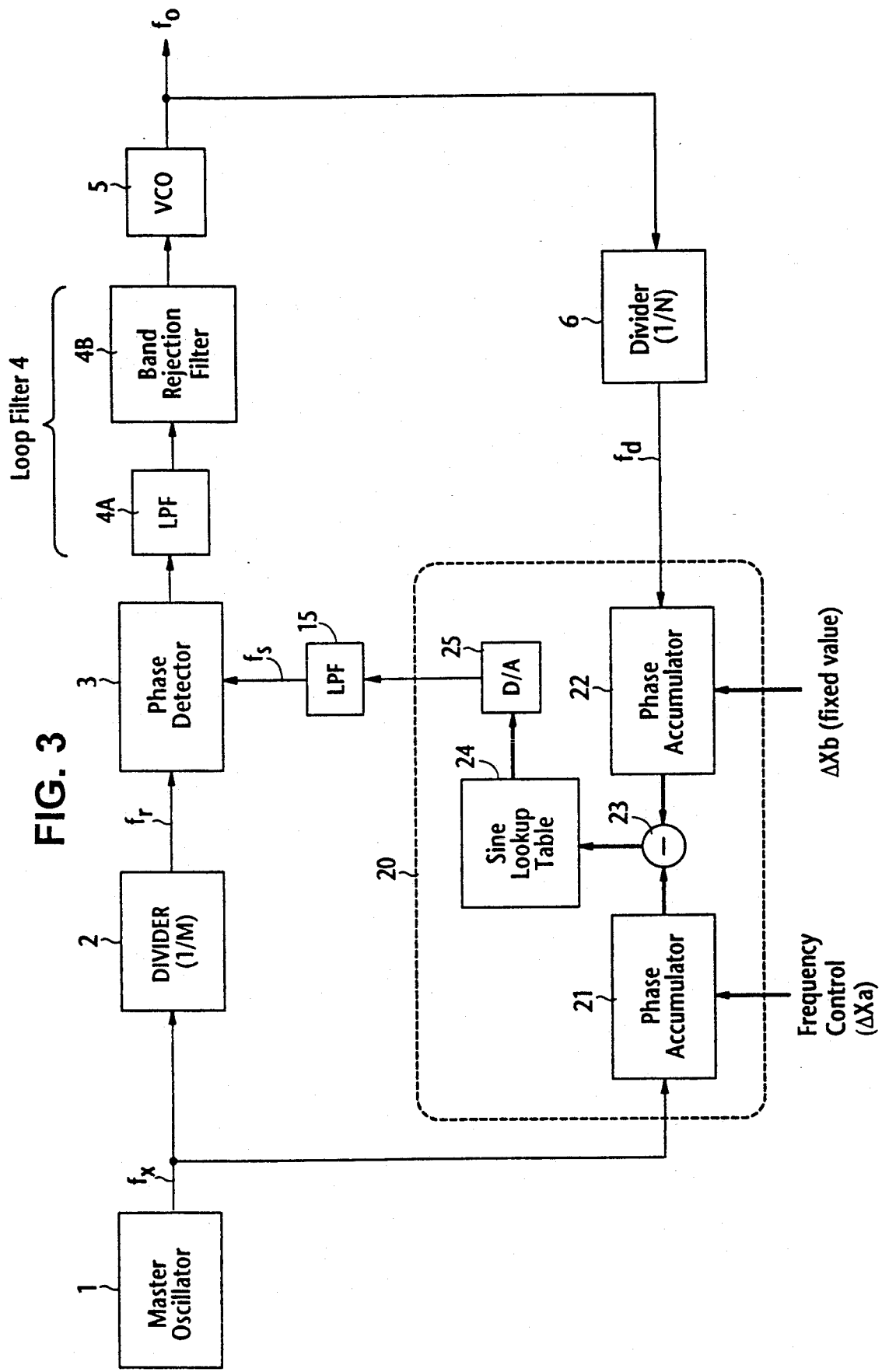
FIG. 3 is a block diagram of a second embodiment of this invention.

It is preferable to implement phase lock loop frequency synthesizers using LSI technology. A second embodiment of the present invention, shown in FIG. 3, is suitable for the LSI implementation. This embodiment differs from the first embodiment by the use of a differential DDS 20 instead of the DDS 10 and mixer 14 of the previous embodiment. It is seen that differential DDS 20 is comprised of a first phase accumulator 21 clocked by the master oscillator 1 at frequency $f_x$ and a second phase accumulator 22 clocked by the frequency divider 6 at frequency $f_d$. Each phase accumulator has a modulo value of L as the accumulator of the previous embodiment. Phase accumulators 21 and 22 feed their output signals to a digital subtractor 23 which detects the difference between the two inputs and outputs a signal indicative of the difference to a sine lookup table 24 as an address signal. A periodic signal is generated by sine lookup table 24 and output to D/A converter 25. The output of D/A converter 25 is coupled to the low-pass filter 15.

Phase accumulator 21 receives a digital fine frequency control signal $\Delta Xa$ to determine the phase increment for accumulation at the master clock rate, while phase accumulator 22 receives a fixed digital value $\Delta Xb$ to determine the phase increment for accumulation at a clock rate which is 1/N of the VCO output frequency.

By setting $\Delta Xa$ equal to a non-zero value and $\Delta Xb$ equal to zero, the differential DDS 20 operates as if it were a normal, single-accumulator DDS clocked at the master clock rate, and in this case, the output frequency $f_{s1}$ of DDS 20 is given by:

$$f_{s1} = (f_x)(\Delta Xa)/L \tag{14}$$

Conversely, if $\Delta Xa$ is set equal to zero and $\Delta Xb$ to a non-zero value, the differential DDS 20 operates as if it were a normal, single-accumulator DDS clocked at the rate of the output of frequency divider 6, and in this case, the output frequency $f_{s2}$ of DDS 20 is given by:

$$f_{s2} = (f_d)(\Delta Xb)/L = (f_o)(\Delta Xb)/(L)(N') \tag{15}$$

where N' is the integer of divider 6 when the DDS 20 is clocked exclusively by the output of divider 6.

Therefore, if both of the phase increments $\Delta Xa$ and $\Delta Xb$ are of non-zero value, the output frequency $f_s$ of DDS 20 is represented as:

$$f_s = f_{s2} - f_{s1} = (f_o)(\Delta Xb)/(L)(N') - (f_x)(\Delta Xa)/L \tag{16}$$

By setting $N' = (N)(\Delta Xb)/L$, and $\Delta Xa = \Delta X$, Equation (16) can be rewritten as:

$$f_s = (f_o)(N) - (f_x)(\Delta X)/L \tag{17}$$

Since Equation (17) is identical to Equation (11), the frequency synthesizer of the second embodiment operates exactly in the same manner as that of the first embodiment.

What is claimed is:

1. A frequency synthesizer comprising:
   a divide-by-M frequency divider for receiving an externally generated reference clock signal of constant frequency and producing a frequency-divided reference clock signal;
   a phase detector having a reference input for receiving said frequency-divided reference clock signal, a feedback input, and a phase detector output;
   a loop filter having an input coupled to said phase detector output, and a loop filter output;
   a voltage controlled oscillator having an input coupled to said loop filter output, and an oscillator output for providing a synthesizer output signal;
   a divide-by-N frequency divider connected to said oscillator output for producing a frequency-divided synthesizer output signal;
   a direct digital synthesizer (DDS) having a clock input for receiving said externally generated reference clock signal, a frequency control input for receiving externally generated phase data, and a DDS output; and
   differential detector means having a first input for receiving the frequency-divided synthesizer output signal from the divide-by-N frequency divider, a second input coupled to said DDS output for producing a differential signal indicative of a frequency difference between signals at said first and second inputs, and a differential detector output coupled to the feedback input of the phase detector for providing the differential signal thereto.

2. A frequency synthesizer as claimed in claim 1, wherein said direct digital synthesizer comprises:
   a phase accumulator having a phase input for receiving said phase data, a clock input for receiving said reference clock signal for accumulating the phase data at the rate of said reference signal, and an accumulator output;
   a memory having a plurality of addressable storage locations each storing a predetermined sine value, an address input coupled to said accumulator output, and a memory output; and
   a digital to analog converter having a converter input coupled to said memory output, and a converter output coupled to the second input of said differential detector means.

3. A frequency synthesizer as claimed in claim 1, wherein said differential detector means comprises:
   a mixer having a first input coupled to said DDS output, a second input coupled to said oscillator output, and a mixer output; and
   a low-pass filter having an input coupled to the mixer output, and an output coupled to said feedback input of the phase detector.

4. A frequency synthesizer as claimed in claim 1, wherein said differential detector means comprises:
   a first phase accumulator having a phase input for receiving said externally generated phase data, a clock input for receiving said reference clock signal for accumulating the phase data at the rate of said reference clock signal, and a first accumulator output;

a second phase accumulator having a phase input for receiving constant value phase data, a clock input coupled to the output of said divide-by-N frequency divider, and a second accumulator output;

a subtractor having a first input coupled to the first accumulator output and a second input coupled to said second accumulator output, and a subtractor output;

a memory having a plurality of addressable storage locations each storing a predetermined sine value, an address input coupled to said subtractor output and a memory output;

a digital to analog converter having a converter input coupled to said memory output and a converter output; and a low-pass filter having an input coupled to said converter output and an output coupled to said feedback input of the phase detector.

5. A frequency synthesizer as claimed in claim 1, wherein said loop filter comprises a series of a low-pass filter and a band rejection filter.

6. A frequency synthesizer comprising:

reference clock means for generating a reference clock signal;

first divider means for receiving the reference clock signal and dividing the frequency of the reference clock signal by M and producing a frequency-divided reference clock signal;

phase detector means for receiving said frequency-divided reference clock signal and a feedback signal, detecting a phase differential between said frequency-divided reference clock signal and said feedback signal and producing a corresponding error signal;

loop filter means for filtering noise in said error signal and producing a filtered error signal;

variable oscillator means for generating a variable oscillator output signal in response to said filtered error signal;

second divider means for receiving the variable oscillator output signal, dividing the frequency of the variable oscillator output signal by N and producing a frequency-divided variable oscillator output signal;

phase accumulator means for receiving a digital frequency control signal indicative of a phase increment value and accumulating phase increment values at a rate corresponding to said reference clock signal from said reference clock means, and producing an accumulator output signal corresponding to the accumulated phase increment values;

memory means for storing a plurality of digital amplitude values representing instantaneous amplitude values of an analog periodic signal and producing a memory output signal indicative of the digital amplitude value corresponding to each accumulated phase increment value of said accumulator output signal;

converter means for converting the digital amplitude values of the memory output signal to analog amplitude values, and producing a corresponding analog periodic signal; and mixer means for modulating said periodic signal from said converter means with said frequency-divided variable oscillator output signal, producing a mixer output signal indicative of the modulated periodic signal, and providing the mixer output signal to said phase detector means as said feedback signal.

7. A frequency synthesizer as claimed in claim 6, wherein said loop filter means comprises a series of a low-pass filter and a band rejection filter.

8. A frequency synthesizer comprising:

reference clock means for generating a reference clock signal;

phase detector means for receiving said reference clock signal and a feedback signal, detecting a phase difference between said reference clock signal and said feedback signal and producing a corresponding error signal;

loop filter means for filtering noise in said error signal and producing a filtered error signal;

variable oscillator means for generating a variable oscillator output signal in response to said filtered error signal;

first phase accumulator means for receiving a digital frequency control signal indicative of a first phase increment value and accumulating first phase increment values at a rate corresponding to said reference clock signal, and producing a first accumulator output signal corresponding to the accumulated first phase increment values;

second phase accumulator means for receiving a digital signal of a constant value indicative of a second phase increment value and accumulating second phase increment values at a rate corresponding to said variable oscillator output signal, and producing a second accumulator output signal corresponding to the accumulated second phase increment values;

subtractor means for receiving said first and second accumulator output signals, detecting accumulated phase difference values between the accumulated first phase increment values and the accumulated second phase increment values, and producing a corresponding subtractor output signal;

memory means for storing a plurality of digital amplitude values representing instantaneous amplitude values of an analog periodic signal and producing a memory output signal indicative of the digital amplitude value corresponding to each accumulated phase difference value of said subtractor output signal; and converter means for converting the digital amplitude values of the memory output signal to analog amplitude values, producing a corresponding analog period signal, and providing the analog periodic signal as said feedback signal.

9. A frequency synthesizer as claimed in claim 8, further comprising:

first divider means for receiving the reference clock signal, dividing the reference clock signal frequency by M, and providing to said phase detector means said reference clock signal corresponding in frequency to said reference clock frequency divided by M; and second divider means for receiving the variable oscillator output signal, dividing the variable oscillator output signal frequency by N, and providing to said second phase accumulator means said variable oscillator output signal corresponding in frequency to said variable oscillator output signal frequency divided by N.

10. A frequency synthesizer as claimed in claim 8, wherein said loop filter means comprises a series of a low-pass filter and a band rejection filter.

* * * * *